(12) United States Patent
Takagi et al.

(10) Patent No.: US 8,357,620 B2
(45) Date of Patent: Jan. 22, 2013

(54) LASER ANNEALING METHOD AND LASER ANNEALING APPARATUS

(75) Inventors: Katsuji Takagi, Kanagawa (JP); Akio Machida, Kanagawa (JP); Toshio Fujino, Kanagawa (JP); Tadahiro Kono, Kanagawa (JP); Norio Fukasawa, Kanagawa (JP); Shinsuke Haga, Kanagawa (JP)

(73) Assignee: Sony Corporation, Tokyo (JP)

( * ) Notice: Subject to any disclaimer, the term of this patent is extended or adjusted under 35 U.S.C. 154(b) by 295 days.

(21) Appl. No.: 12/574,024

(22) Filed: Oct. 6, 2009

(65) Prior Publication Data
US 2010/0093112 A1   Apr. 15, 2010

(30) Foreign Application Priority Data

Oct. 10, 2008  (JP) ................ 2008-263561

(51) Int. Cl.
  *H01L 21/00* (2006.01)
(52) U.S. Cl. ............... 438/799; 438/487; 257/E21.328; 257/E21.529; 118/641
(58) Field of Classification Search .................. 438/799, 438/7, 487, 798; 257/E21.529, E21.328, 257/E21.497, E21.347; 219/121.61; 117/44, 117/904; 118/641
See application file for complete search history.

(56) References Cited

U.S. PATENT DOCUMENTS

| | | | |
|---|---|---|---|
| 6,870,126 B2* | 3/2005 | Jyumonji et al. | 219/121.65 |
| 7,744,274 B1* | 6/2010 | Grek et al. | 374/124 |
| 2003/0017658 A1* | 1/2003 | Nishitani et al. | 438/149 |
| 2004/0061149 A1* | 4/2004 | Jyumonji et al. | 257/268 |
| 2005/0082264 A1* | 4/2005 | Nagai et al. | 219/121.62 |
| 2009/0004763 A1* | 1/2009 | Ono et al. | 438/7 |
| 2009/0201955 A1* | 8/2009 | Weigl et al. | 372/29.011 |

FOREIGN PATENT DOCUMENTS

| | | |
|---|---|---|
| JP | 06-224276 | 8/1994 |
| JP | 09-102468 | 4/1997 |
| JP | 11-268859 | 9/1999 |
| JP | 2004-087667 | 3/2004 |
| JP | 2004-342875 | 12/2004 |

OTHER PUBLICATIONS

Japanese Patent Office Action corresponding to Japanese Serial No. 2008-263561 dated Jul. 20, 2008.

\* cited by examiner

*Primary Examiner* — Caridad Everhart
(74) *Attorney, Agent, or Firm* — SNR Denton US LLP (57) ABSTRACT

An embodiment of the invention provides a laser annealing method, including the steps of radiating a laser beam to an amorphous film on a substrate while scanning the laser beam for the amorphous film, crystallizing the amorphous film, detecting a light quantity of laser beam reflected from the substrate and a scanning speed of the laser beam while the radiation and the scanning of the laser beam are carried out for the amorphous film, and controlling a radiation level and the scanning speed of the laser beam based on results of comparison of the light quantity of laser beam reflected from the substrate, and the scanning speed of the laser beam with respective preset references.

10 Claims, 9 Drawing Sheets

WAVELENGTH λ =405mm
EXECUTED NA =0.8

LASER ANNEALING METHOD AND LASER ANNEALING APPARATUS

BACKGROUND OF THE INVENTION

1. Field of the Invention

The present invention relates to a laser annealing method and a laser annealing apparatus, and more particularly to a laser annealing method and a laser annealing apparatus for radiating a laser beam to an amorphous film on a substrate while scanning the laser beam for the amorphous film, thereby crystallizing the amorphous film.

2. Description of the Related Art

In a flat type display device such as a liquid crystal display device or an organic Electro Luminescence (EL) display device, a Thin Film Transistor (TFT) is used as a switching element used to carry out active matrix display by using a plurality of pixels.

A poly-Si TFT in which poly-Si, μc-Si or the like is used in an active region, and an amorphous Si TFT in which an amorphous Si is used in an active region are known as the TFT. Of these poly-Si TFT and the amorphous Si TFT, the poly-Si TFT has the feature that a mobility of a carrier is about ten to 100 times as large as that in the amorphous Si TFT, and thus poly-Si has the very superior characteristics as a constituent material for the switching element.

Here, Japanese Patent Laid-Open No. 2004-87667 discloses a technique for crystallizing amorphous Si. With this technique, a continuous wave (CW) laser beam or a quasi-CW laser beam having a pulse frequency which is as very high as several tens or more of megaheltz is relatively moved (scanned) for a Si film deposited on a substrate in one direction.

With this technique, the crystal is grown along one direction by the scanning the laser beam for the Si film. Crystal grains are formed approximately in parallel with a growth direction. Therefore, with regard to an electrical conductivity in the crystal growth direction, a mobility can be increased because a density of the crystal grains which carriers cross is reduced.

SUMMARY OF THE INVENTION

However, with existing technique, it is difficult to optimally control the parameters such as an intensity of the laser beam, and the scanning speed of the laser beam on a steady basis when the amorphous Si is crystallized.

The present invention has been made in order to solve the problems described above, and it is therefore desirable to provide a laser annealing method and a laser annealing apparatus each of which is capable of uniformly crystallizing an amorphous film by using laser annealing for radiating a laser beam to the amorphous film while the laser beam is scanned for the amorphous film.

In order to attain the desire described above, according to an embodiment of the present invention, there is provided a laser annealing method including the steps of: radiating a laser beam to an amorphous film on a substrate while scanning the laser beam for the amorphous film, thereby crystallizing the amorphous film; detecting a light quantity of laser beam reflected from the substrate and a scanning speed of the laser beam while the radiation and the scanning of the laser beam are carried out for the amorphous film; and controlling a radiation level and the scanning speed of the laser beam based on results of comparison of the light quantity of laser beam reflected from the substrate, and the scanning speed of the laser beam with respective preset references.

In the embodiment of the present invention, the light quantity of laser beam reflected from the substrate, and the scanning speed of the laser beam are detected, and are controlled based on the results of the comparison with the respective preset references. Therefore, the stable radiation level and scanning speed can be obtained in accordance with the respective preset references.

In addition, the comparison of the light quantity of laser beam reflected from the substrate, and the scanning speed of the laser beam with the respective preset references is carried out multiple times every predetermined number of times of the scanning operation. Also, the radiation level of the laser beam and scanning speed of the laser beam are controlled by using a plurality of comparison results. As a result, temporal changes in radiation level and scanning speed of the laser beam can be corrected.

According to another embodiment of the present invention, there is provided a laser annealing apparatus including: a modulating portion configured to adjust a radiation level and a scanning speed of a laser beam emitted from a laser light source to be radiated to an amorphous film on a substrate; a scanning position detecting portion configured to detect a scanning position of the laser beam scanned through the modulating portion; a reflected light quantity detecting portion configured to detect a light quantity of laser beam reflected from the substrate; and a control portion configured to compare the scanning speed arithmetically operated from the scanning position of the laser beam detected by the scanning position detecting portion with a preset reference, and compare the light quantity of laser beam reflected from the substrate detected by the reflected light quantity detecting portion with a preset reference, thereby controlling the radiation level and the scanning speed of the laser beam adjusted by the modulating portion in accordance with the comparison results.

In this case, a glass or a semiconductor such as silicon is used as the material for the substrate. In addition, the amorphous film, for example, is an amorphous silicon film. An acousto-optical deflector is used as an example of the modulating portion.

According to the present embodiments, the optimal and uniform crystal quantity can be stably obtained on a steady basis in the annealing for the amorphous film.

DETAILED DESCRIPTION OF THE PREFERRED EMBODIMENTS

The preferred embodiments of the present invention will be described in detail hereinafter with reference to the accompanying drawings. Note that, the description will be given in the following order.

1. Laser annealing apparatus (apparatus construction, apparatus operation, and point of crystallization by laser annealing).
2. Laser annealing method.
3. Examples (example of control portion of laser annealing apparatus, and example of laser annealing method).

1. Laser Annealing Apparatus

[Apparatus Construction]

Figure 1:
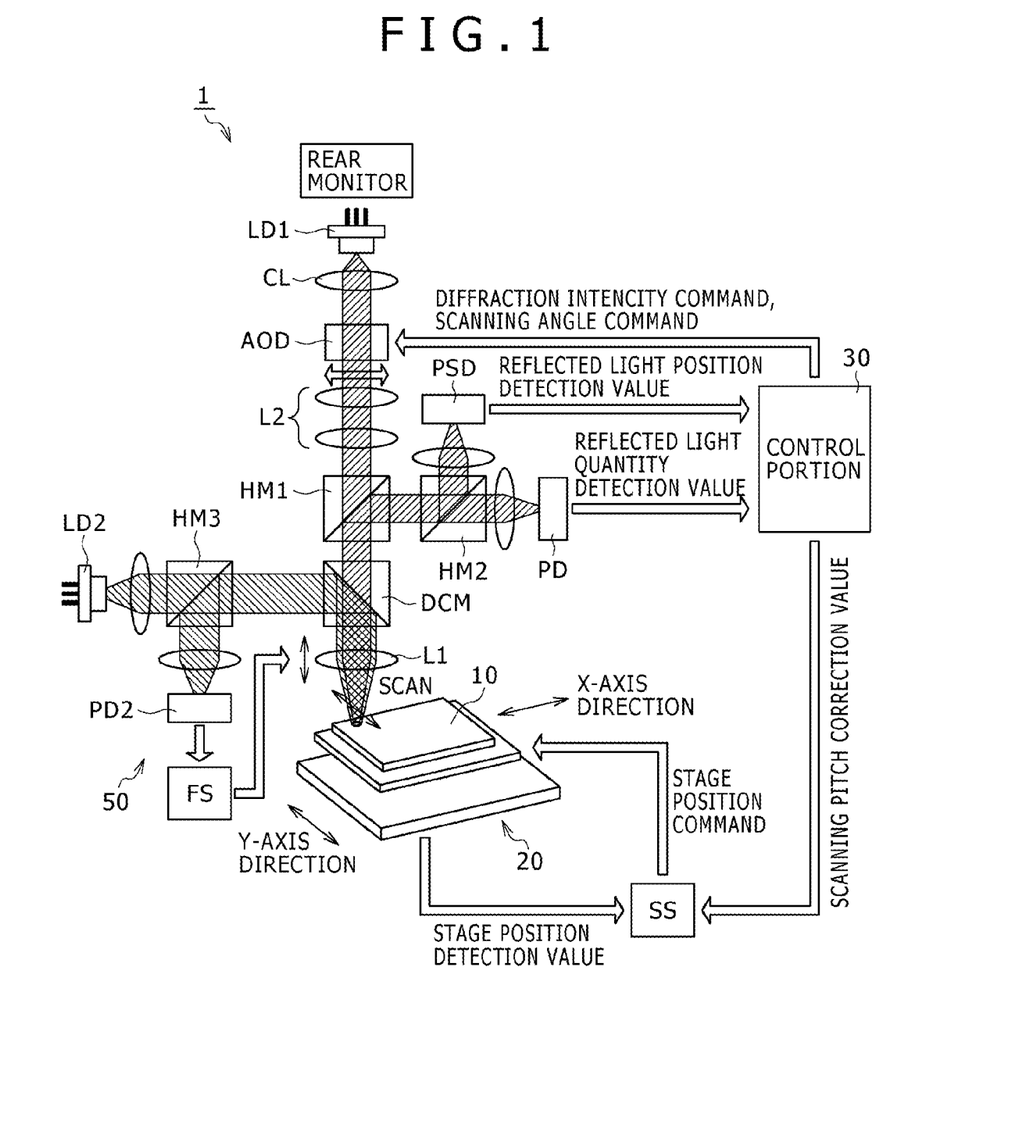
FIG. 1 is a view showing a construction of a laser annealing apparatus according to an embodiment of the present invention.

FIG. 1 is a schematic view showing a construction of a laser annealing apparatus according to an embodiment of the present invention. The laser annealing apparatus 1 of the embodiment is an apparatus for radiating a laser beam to an amorphous film on a substrate 10 while scanning the laser beam for the amorphous film on the substrate 10, thereby crystallizing the amorphous film. The feature of the laser annealing apparatus 1 of the embodiment is that in crystallizing the amorphous film, a state of the crystallization is detected in the form of a light quantity of laser beam reflected from the substrate 10, a scanning speed of the laser beam is detected, and a radiation level and the scanning speed of the laser beam are successively controlled in accordance with feedback control. Here, although in the embodiment, an amorphous Si film is exemplified as the amorphous film, the present invention can also apply to any other suitable film which is crystallized by the laser annealing.

The laser annealing apparatus 1 includes a laser light source (laser diode) LD1, an acousto-optical deflector (hereinafter referred to as "an AOD") as a modulator, a half mirror HM1, a reflected light quantity detector PD, and a reflected light position detector PSD. Also, the laser annealing apparatus 1 includes a stage 20 on which a substrate 10 is placed, a control portion 30, a focusing optical system 50 for focusing a laser beam.

A laser diode which emits a laser beam having a wavelength and an output necessary for crystallization of the amorphous film is used as the laser light source LD1. In the embodiment, there is used the laser light source LD1 for emitting a blue-violet semiconductor laser beam (its wavelength λ=405 nm, and its output=200 mW). An amount of luminescence of the laser light source LD1 is detected by a rear monitor.

The AOD controls a radiation level and a scanning angle of a laser beam emitted from the laser light source LD1 for the substrate 10. A diffraction intensity command and a scanning angle command are issued from the control portion 30 which will be described later to the AOD. Thus, the AOD adjusts the radiation level and the scanning angle of the laser beam in accordance with the diffraction intensity command and the scanning angle command.

The half mirror HM1 is disposed on a radiation path of the laser beam. Also, the half mirror HM1 transmits the laser beam outputted from the AOD, and reflects the laser beam reflected from the substrate 10 in a direction different from that of the laser beam emitted from the laser light source LD1, thereby sending the reflected laser beam to each of the reflected light quantity detector PD and the reflected light position detector PSD in the subsequent stage. A deflection beam splitter, for example, is used as the half mirror HM1. The laser beam reflected by the half mirror HM1 is branched to the reflected light quantity detector PD side and the reflected light position detector PSD side by another half mirror HM2.

The reflected light quantity detector PD is a light-receiving sensor for detecting a light quantity of laser beam reflected from the substrate 10, and outputting an electrical signal corresponding to the light quantity thus detected. The reflected light position detector PSD detects a radiation position of the laser beam reflected from the substrate 10, and outputs an electrical signal corresponding to the scanning position of the laser beam in the scanning by the AOD. This is to say, the reflected light position detector PSD is a line-like light-receiving sensor. When the laser beam is scanned by the AOD, an incident angle of the laser beam to the substrate 10 differs depending on the scanning positions. Therefore, since an angle of the laser beam at which the laser beam is reflected from the substrate 10 also differs depending on the scanning positions, the scanning position can be detected in accordance with the position where the laser beam is received by the reflected light position detector PSD.

The substrate 10 is placed on the stage 20, and also the stage 20 has a moving mechanism for moving the substrate 10 either in the scanning direction of the laser beam or in a direction perpendicularly intersecting the scanning direction of the laser beam. It is noted that in the embodiment, the scanning direction of the laser beam on the substrate 10 is defined as a Y-axis direction, and the direction perpendicularly intersecting the scanning direction of the laser beam is defined as an X-axis direction. In the embodiment, there is used the stage 20 which, for example, has about 0.28 nm as a resolution about the movements along the X- and Y-axis directions. During the scanning of the laser beam, the stage 20 is moved in the X-axis direction, thereby annealing one area of the substrate 10. In addition, when another area of the substrate 10 is desired to be annealed, the stage 20 is moved in the X-axis direction and in the Y-axis direction by predetermined amounts, respectively, in a state in which the radiation of the laser beam is stopped.

The focusing optical system 50 includes an objective lens L1, a red semiconductor laser light source LD2 for detecting a focal position, an optical receiver PD2, and a driving portion FS. In this case, the objective lens L1 adjusts the focal position of the laser beam. The optical receiver PD2 receives a reflected beam of a red laser beam from the substrate 10. Also, the driving portion FS drives the objective lens L1 in accordance with a quantity of light received by the optical receiver PD2.

The red laser beam emitted from the red semiconductor laser light source LD2 is transmitted through a half mirror HM3, and is reflected by a dichroic mirror DCM to be radiated to the substrate 10. The red laser beam does not contribute to the crystallization of the amorphous film. Thus, the red laser beam is reflected by the substrate 10, is reflected by the dichroic mirror DCM again, and is reflected by the half mirror HM3, thereby reaching the optical receiver PD2. A quantity of light received by the optical receiver PD2 corresponding to a condensing state in the objective lens L1, and the driving portion FS moves the objective lens L1 in correspondence to the quantity of light received. Also, the feedback control is carried out for the detection in the optical receiver PD2, and the driving of the objective lens L1 so that the condensing state becomes minimum. In such a manner, the control for adjusting the focal point of the objective lens L1 on the substrate 10 is carried out.

The control portion 30 executes processing for comparing a scanning speed arithmetically operated from the scanning position of the laser beam detected by the reflected light position detector PSD with a preset reference. Also, the control portion 30 executes processing for comparing the light quantity of laser beam reflected from the substrate 10 detected by the reflected light quantity detector PD with a preset reference. Also, the control portion 30 controls the light quantity of laser beam, and the scanning speed of the laser beam which are adjusted in the AOD in accordance with the comparison results.

That is to say, the control portion 30 arithmetically operates the scanning speed from the scanning position of the laser beam detected by the reflected light position detector PSD, and compares the scanning speed thus arithmetically operated with a preset reference scanning speed. As a result of the comparison, when a difference between the scanning speed and the preset reference scanning speed falls within a preset value (for example, 5%), the control portion 30 judges that the scanning speed agrees with the preset reference scanning speed, and holds the scanning angle command issued to the AOD as it is. On the other hand, when the scanning speed is higher than the preset reference scanning speed (for example, the scanning speed is higher 5% or more than the preset reference scanning speed), the control portion 30 issues the scanning angle command to the AOD so that the scanning speed is made lower than current one. On the other hand, when the scanning speed is lower than the preset reference scanning speed (for example, the scanning speed is lower 5% or more than the reference scanning speed), the control portion 30 issues the scanning angle command to the AOD so that the scanning speed is made higher than current one.

In addition, the control portion 30 compares the light quantity of laser beam detected by the reflected light quantity detector PD with a preset reference light quantity. As a result of the comparison, for example, when a difference between the light quantity of laser beam detected, and the preset reference light quantity falls within a preset value (for example, 5%), the control portion 30 judges that the light quantity of laser beam detected agrees with the preset reference light quantity, and holds the diffraction intensity command issued to the AOD as it is. On the other hand, when the light quantity of laser beam detected is more than the preset reference light quantity (for example, the light quantity of laser beam detected is more 5% or more than the reference light quantity), the control portion 30 issues the diffraction intensity command to the AOD so that the light quantity of laser beam detected is made less than current one. On the other hand, when the light quantity of laser beam detected is less than the preset reference light quantity (for example, the light quantity of laser beam detected is less 5% or more than the preset reference light quantity), the control portion 30 issues the diffraction intensity command to the AOD so that the light quantity of laser beam detected is made more than current one.

[Operation of Apparatus]

The laser beam emitted from the laser light source LD1 is sent to the AOD through a collimator lens CL. The AOD carries out intensity modulation and scanning angle control for the laser beam passing through the AOD in accordance with the diffraction intensity command and the scanning angle command, respectively.

After that, the laser beam is guided to a plurality of lenses L2, is condensed by the objective lens L1, and is finally radiated to the amorphous film on the substrate 10 placed on the stage 20. A radiation level of the laser beam radiated to the amorphous film on the substrate 10 is set based on the intensity modulation by the AOD. In addition, the laser beam is scanned at a predetermined width on the substrate 10 in accordance with the scanning angle control made by the AOD.

When the laser beam is radiated to the amorphous film on the substrate 10 while the laser beam is scanned for the amorphous film, the substrate 10 is moved in the X-axis direction by the driving mechanism of the stage 20. An X-axis slide of the stage 20 is controlled at a speed corresponding to a set scanning pitch of the laser beam, and thus the scanning pitch is made with high precision. After completion of a constant speed movement of the stage 20 along the X-axis direction, and the radiation by the repetitive laser beam scanning within one area, the Y-axis of the stage 20 is moved to a next area in a step manner. After that, the radiation based on the scanning of the laser beam is carried out again while the constant speed movement of the stage 20 along the X-axis direction is controlled. This repetition results in the crystallization of the amorphous film in a predetermined area of the substrate 10.

[Point of Crystallization by Laser Annealing]

In order to obtain the optimal and uniform crystallization in the crystallizing the amorphous film by the laser annealing, it is important to control the radiation energy of the laser beam. That is to say, the parameters such as the intensity of the laser beam, the scanning speed of the laser beam, and the substrate movement speed have to be optimally controlled so as to become constant on a steady basis.

With the existing technique, for example, for searching for these optimal parameters, the substrate to which the laser beam is radiated under certain parameter conditions was removed from the apparatus, and a visual inspection was carried out for that substrate by using an optical microscope, an electron microscope or the like. Also, the radiation of the laser beam, and the visual inspection were repetitively carried out until the uniform and best parameters were found out.

However, in the case of the repetition of the visual inspection and the parameter condition setting, the non-quantitative evaluation is merely carried out through the visual contact. As a result, it may be approximately impossible to carry out quantitatively the visual contact with the satisfactory reproducibility so as to cover the entire area of the substrate. For this reason, finally, after the process is progressed up to the manufacture of the elements such as the TFT, the electrical characteristics of the elements are measured, thereby evaluating the dispersion and the absolute values for the entire area of the substrate. Also, when the dispersion failure is found out in the process, the process returns back to the laser crystallizing process again, and the investigation into the cause of the dispersion failure and the measures taken to cope with that cause are carried out. Then, the parameter conditions are re-optimized. After that, it may be necessary to carry out a work routine up to the radiation of the laser beam, the visual inspection, the manufacture of the elements such as the TFT, and the evaluation of the electrical characteristics again. It takes about two to three months to carry out one work routine. Thus, this work routine is repetitively carried out several times, which results in the waste of a lot of time.

In addition, when the manufacture of the TFT array in either the liquid crystal display device or the organic EL display device is considered as one application of the crystallization by the radiation of the laser beam, the speed-up of the manufacturing tact following the growing in size of the panel is the very important problem. With regard to one of the resolution method thereof, a method is important in which one laser annealing apparatus is loaded with a plurality of laser heads, and the crystallization is performed by using multiple laser beams. However, for the purpose of suppressing the dispersion, of crystal quantities among different heads, following the promotion of the multiple laser heads, thereby stably maintaining the optimal state for all the laser heads, when the existing technique as described above is used, a series of work routines requiring several months has to be carried out for each of the plural laser heads.

Figure 2:
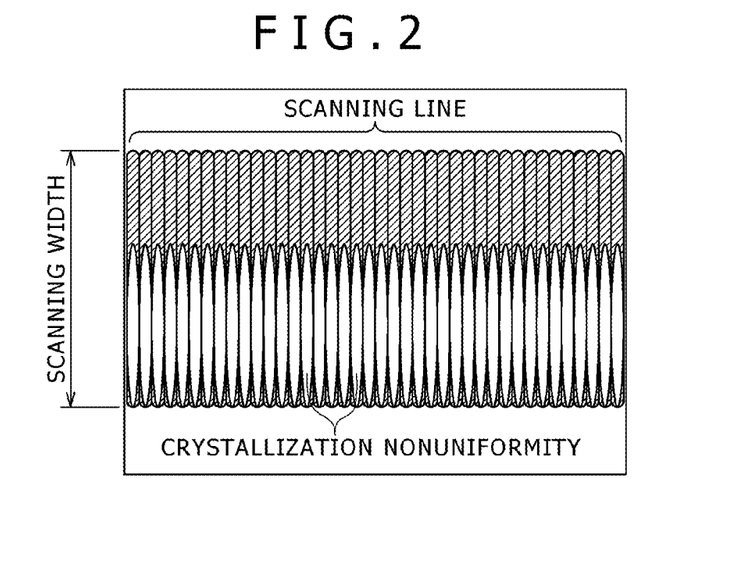
FIG. 2 is a diagram showing a state of a surface of a substrate after completion of radiation of a laser beam by an existing technique.
Figure 3:
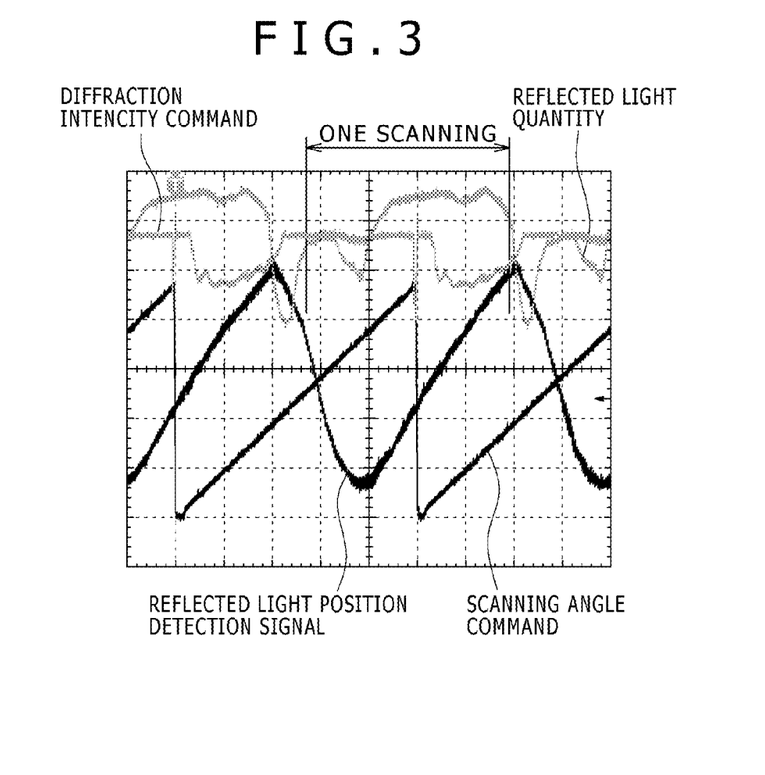
FIG. 3 is a graph showing a reflected light quantity and a reflected light position detection signal, and a diffraction intensity command and a scanning angle command during the radiation of the laser beam by the existing technique.

FIG. 2 is a graph showing a state of a surface of a substrate after completion of the radiation of the laser beam by the existing technique. Also, FIG. 3 is a graph showing a reflected light quantity and a reflected light position detection signal, and a diffraction intensity command and a scanning angle command during the radiation of the laser beam by the existing technique.

As shown in FIG. 2, during one scanning operation of the laser beam, areas different in reflected light quantity from each other (an area having a much reflected light quantity and an area having a little reflected light quantity) exist. This situation, as shown in FIG. 3, is grasped as a change in reflected light quantity during the radiation of the laser beam.

In the embodiment, the control portion 30 controls the diffraction intensity command and the scanning angle command issued to the AOD so that the level of the reflected light quantity becomes the optimal constant value on a steady basis. As a result, the optimal crystallization having the uniform quality is obtained.

Moreover, the reflected light quantity during the radiation of the laser beam reflects the state (overlapping degree) as well of the crystallization by the adjacent scanning. Therefore, the optimal scanning pitches having the equal intervals can also be obtained by controlling either the scanning angle command or an X-axis slide movement command for the stage 20. That is to say, by carrying out the control for making the reflected light quantity for each scanning constant, it is possible to suppress the dispersion of the crystallization in the adjacent scanning lines.

Figure 4:
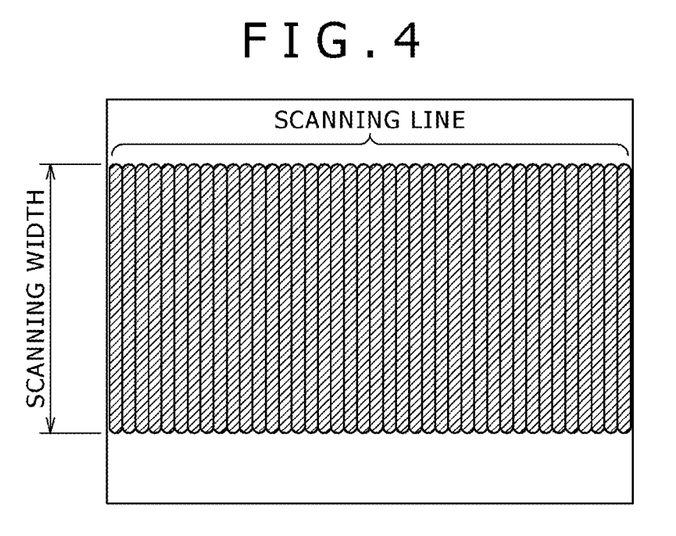
FIG. 4 is a diagram showing a state of a surface of a substrate after completion of radiation of a laser beam using the laser annealing apparatus of the embodiment shown in FIG. 1.
Figure 5:
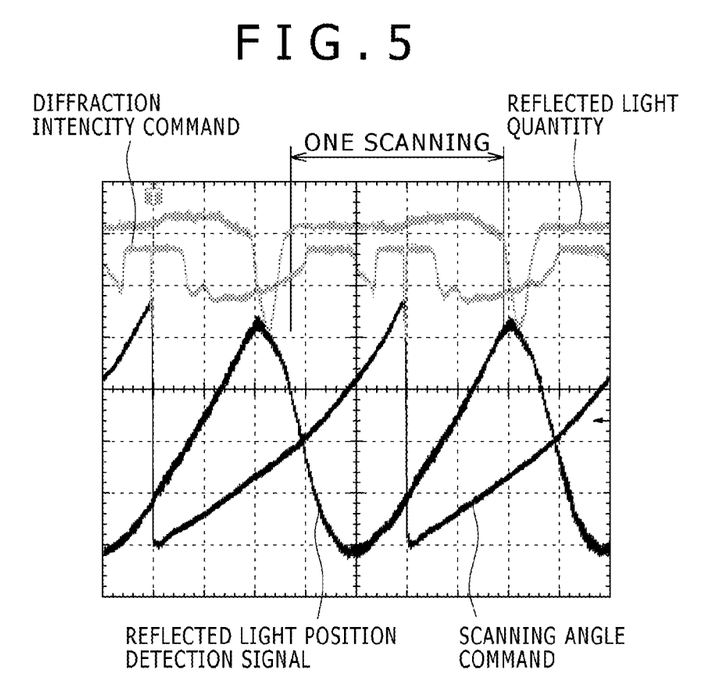
FIG. 5 is a graph showing a reflected light quantity and a reflected light position detection signal, and a diffraction intensity command and a scanning angle command during the radiation of the laser beam in the laser annealing apparatus of the embodiment shown in FIG. 1.

FIG. 4 is a graph showing a state of the substrate surface after completion of the radiation of the laser beam by using the laser annealing apparatus of the embodiment. Also, FIG. 5 is a graph showing the reflected light quantity and the reflected light position detection signal, and the diffraction intensity command and the scanning angle command during the radiation of the laser beam by using the laser annealing apparatus of the embodiment.

With the laser annealing apparatus 1 of the embodiment, the control portion 30 corrects and controls the scanning angle command issued to the AOD so that the scanning speed during one scanning of the laser beam becomes a constant speed. That is to say, a curve of the scanning angle command shown in FIG. 5 becomes more rounded than that of the scanning angle command shown in FIG. 3. Thus, the control portion 30 controls the scanning angle command so that the scanning speed becomes the constant speed.

In addition, with the laser annealing apparatus 1 of the embodiment, the control portion 30 corrects and controls the diffraction intensity command issued to the AOD so that the reflected light quantity becomes constant. That is to say, the diffraction intensity command shown in FIG. 5 is controlled so that the reflected light quantity during the scanning operation becomes constant. As a result, there is improved the uniformity of the level of the reflected light quantity of the laser beam detected by the reflected light quantity detector PD. As shown in FIG. 4, the reflected light quantity during one scanning of the laser beam is uniform. Thus, it is understood from this situation that the uniform crystallization is obtained.

Figure 6:
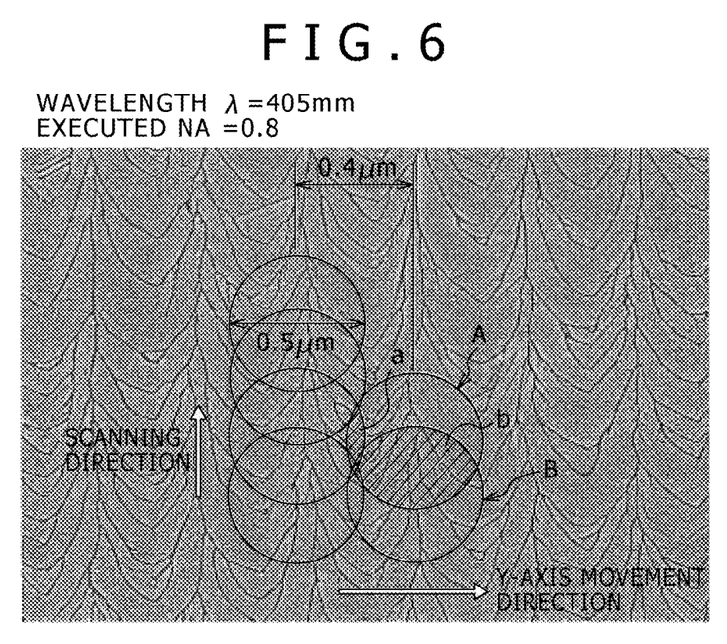
FIG. 6 is a schematic view showing a state of laser beam spots during the radiation of the laser beam.

FIG. 6 is a schematic view showing a state of a beam spot during the radiation of the laser beam. It should be noted that in FIG. 6, for the purpose of facilitating the understood of the description, a beam spot position of the laser beam (indicated by a circle mark in the figure) is illustrated so as to overlap the state of the amorphous film which is previously crystallized. In this case, the laser beam is radiated under a condition of a wavelength $\lambda = 405$ nm, and an executed NA=0.8. Under this condition, a diameter of a beam spot of the laser beam is 0.5 µm. In addition, the scanning speed is 1 m/sec., and the pitch between the scanning concerned and the adjacent scanning (scanning pitch) is 0.4 µm.

When such a beam spot is scanned for the amorphous film on the substrate 10, a change in reflected light quantity during the radiation of the laser beam is obtained from the state of the crystallization and the dissolution by the immediately preceding laser beam radiation within the same scanning, and the state of the crystallization before one scanning.

For example, when the beam spot during the scanning is a circle mark indicated in FIG. 6 by A, an area ("a" indicated in FIG. 6 by slant lines) overlapping the adjacent beam line, and an area ("b" indicated in FIG. 6 by slant lines) overlapping the immediately preceding beam spot (indicated in FIG. 6 by B) become the previously crystallized portion. Therefore, the reflected light from the beam spot (the circle mark indicated in FIG. 6 by A) during the scanning reflects the reflection from the crystallized areas "a" and "b" each indicated in FIG. 6 by the slant lines.

In the embodiment, while the laser beam for crystallization is scanned, the reflected light of the laser beam is detected by the reflected light quantity detector PD. As a result, the state of the area previously crystallized is grasped together with the crystallization as the reflected light quantity, and the feedback control for the radiation level of the laser beam is carried out.

2. Laser Annealing Method

Figure 7:
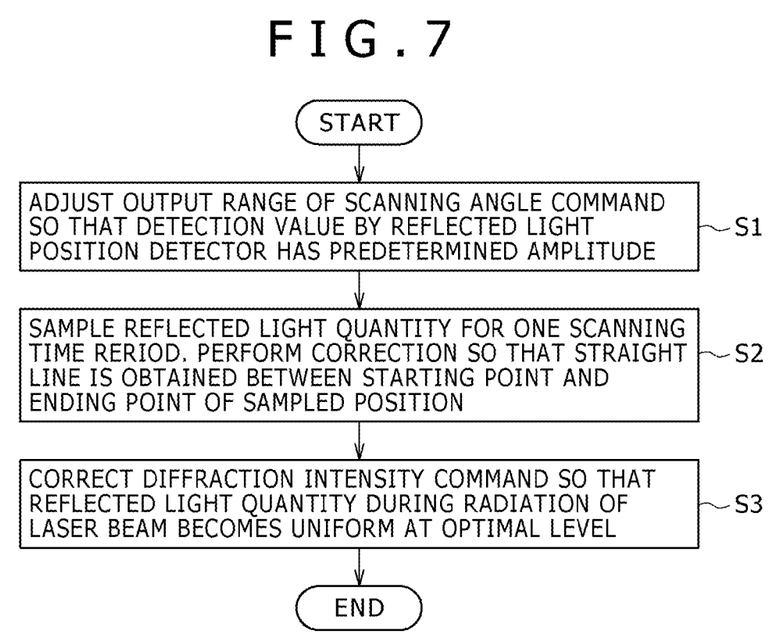
FIG. 7 is a flow chart explaining an outline of a laser annealing method according to another embodiment of the present invention.

FIG. 7 is a flow chart explaining an outline of the laser annealing method according to another embodiment of the present invention. Firstly, a reference about the scanning speed of the laser beam is set. That is to say, an output range of the scanning angle command is adjusted so that a detection value in the reflected light position detector PSD during the radiation of the laser beam has a predetermined amplitude (Step S1).

Next, a position is sampled for one scanning time period of the laser beam by the reflected light position detector PSD. In this connection, even with one scanning made in accordance with the initial scanning angle command, the scanning speed does not become constant (non-linear characteristics). Then, the control portion 30 multiplies sampling values by coefficients, respectively, so that a straight line (linearity) is obtained between a starting point and an ending point of the positions sampled by the reflected light position detector PSD, thereby carrying out the linearization correction.

Figure 8:
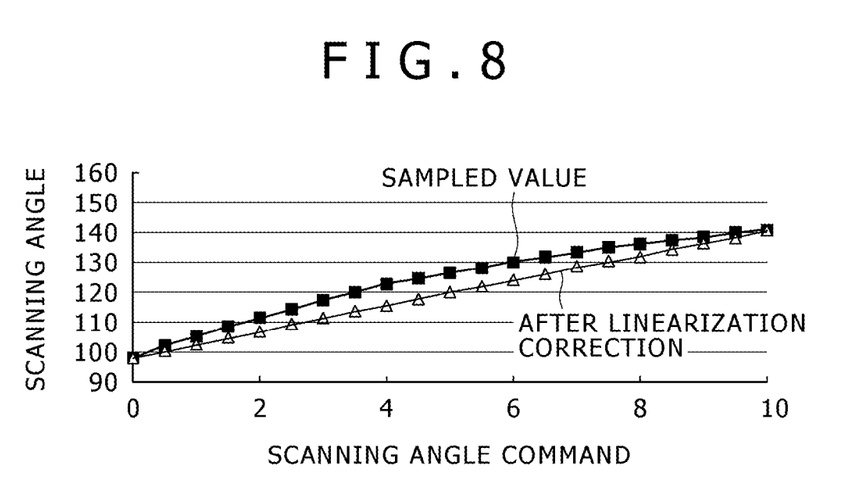
FIG. 8 is a graph showing a relationship between the scanning angle command and a scanning angle.

FIG. 8 is a graph showing a relationship between the scanning angle command and the scanning angle. In the figure, an axis of abscissa represents the scanning angle command, and an axis of ordinate represents the scanning angle. In the sampling, a non-linearity relationship is shown between the scanning angle command and the scanning angle. The control portion 30 multiplies the sampling values in the scanning angle commands by correction coefficients, respectively, so that a straight line is obtained between the starting point and the ending point in the sampling.

Next, the reflected light during the radiation of the laser beam is detected by the reflected light quantity detector PD (Step S3). Also, the control portion 30 receives as its input a signal corresponding to the reflected light quantity detected by the reflected light quantity detector PD, and corrects the diffraction intensity command so that the reflected light quantity becomes uniform at a preset level. The processing in Steps S1 to S3 is repetitively executed for a predetermined time period, whereby it is possible to carry out the laser annealing with the uniform radiation level.

3. Examples

[Example of Control Portion in Laser Annealing Apparatus]

Figure 9:
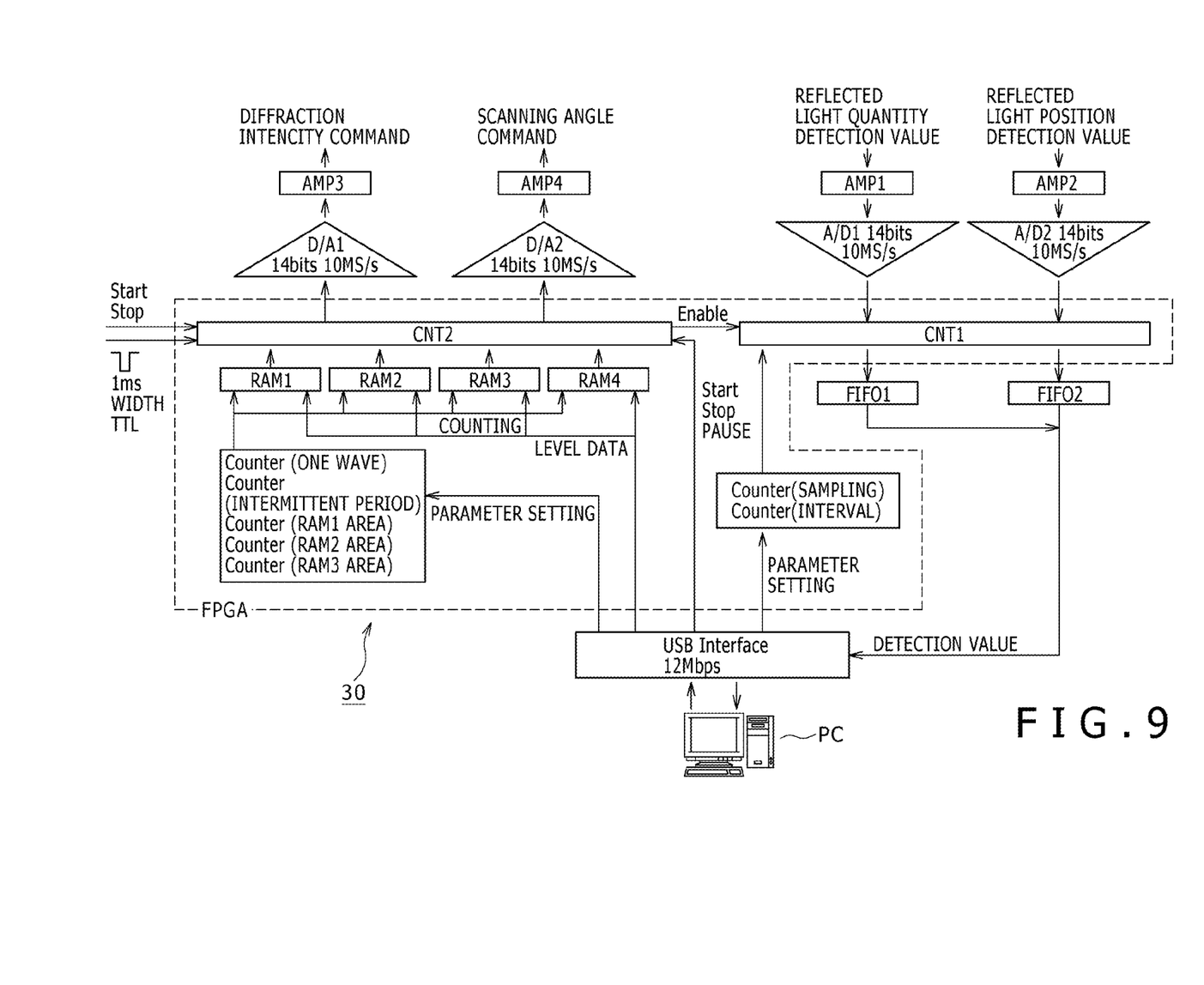
FIG. 9 is a block diagram showing a configuration of an example of a control portion in the laser annealing apparatus of the embodiment shown in FIG. 1.

FIG. 9 is a block diagram explaining an example of the control portion in the laser annealing apparatus according to the embodiment of the present invention. The control portion 30 includes an I/O controller for a signal, and a memory portion for storing therein an input signal and a command. The control portion 30 shown in FIG. 9 is connected to a personal computer PC through a Universal Serial Bus (USB) interface. Also, the input signal is sent from the control portion 30 to the personal computer PC, and the control portion 30 receives as its input the command as a result arithmetically operated in the personal computer PC, and stores the command thus received in the memory portion. It is noted that an arithmetically operating portion may be provided in the control portion 30 without through the personal computer PC.

The control portion 30 includes a controller CNT1 for receiving as its inputs the signals sent from the reflected light quantity detector PD and the reflected light position detector PSD, respectively. An electrical signal based on a reflected light quantity detection value (simply referred to as "a reflected light quantity") detected by the reflected light quantity detector PD is amplified by an amplifier AMP1, and is then converted into a digital signal by an A/D converter A/D1. The control portion 30 receives as its input the digital signal corresponding to the reflected light quantity through the controller CNT1, and stores the digital signal thus received in a FIFO (First-In First-Out)1 as the memory portion.

In addition, an electrical signal (reflected light position detection value) based on the radiation position of the laser beam detected by the reflected light position detector PSD is amplified by an amplifier AMP2, and is then converted into a digital signal by an A/D converter A/D2. The control portion 30 receives as its input the digital signal corresponding to the radiation position of the laser beam through a controller CNT1, and stores the digital signal thus received in an FIFO2 as the memory portion.

Detection timings in the reflected light quantity detector PD and the reflected light position detector PSD are set by a counter which operates in accordance with a command issued from the personal computer PC. The counter carries out a counting operation in accordance with a value for parameter setting sent from the personal computer PC, and issues a command to start the sampling operation to the controller CNT1 every predetermined counting. In response to the command to start the sampling operation, the controller CNT1 fetches therein the detection values obtained in the reflected light quantity detector PD and the reflected light position detector PSD, respectively.

The digital signal corresponding to the reflected light quantity, and the digital signal corresponding to the radiation position of the laser beam which are stored in the FIFO1 and FIFO2, respectively, are sent from the control portion 30 to the personal computer PC through the USB interface. The personal computer PC carries out an arithmetical operation for comparing the digital signal sent thereto from the control portion 30 with a preset reference value. Also, as a result of the arithmetical operation for the comparison, the personal computer PC obtains correction values for the diffraction intensity command and the scanning angle command each of which is intended to be given to the AOD, and transfers the correction values thus obtained to the control portion 30. These correction values are values in which differences between levels of the signals corresponding to the reflected light quantity and the radiation position, respectively, both sent from the control portion 30, and given reference values fall within preset tolerances, respectively. A user can set the reference values and the tolerances by using the personal comparator PC.

The control portion 30 stores the correction values for the diffraction intensity command and the scanning angle command sent thereto from the personal computer PC in a RAM (Random Access Memory)1 to a RAM4 each as the memory portion. The control portion 30 is provided with a plurality of RAMs. In the example shown in FIG. 9, the control portion 30 is provided with the four RAMS, i.e., the RAM1 to the RAM4. Of the RAM1 to the RAM4, the RAM1 to the RAM3 store therein the diffraction intensity command in accordance with which the radiation level of the laser beam is set. In addition, the RAM4 stores therein the scanning angle command in accordance with which the scanning speed is set.

The correction values for the diffraction intensity command based on the signals corresponding to the reflected light quantity and the radiation position, respectively, which are obtained by carrying out the sampling every predetermined number of times of the scanning operation are stored in the RAM1 to the RAM3, respectively. Although in the example, the sampling is carried out every predetermined number of times of the scanning operation, the sampling may be carried out every predetermined area to which the laser beam is radiated.

When the control portion 30 is provided with the three RAMs, i.e., the RAM1 to the RAM3, the correction values for the diffraction intensity command based on the sampling operation for three portions are stored in the RAM1 to the RAM3, respectively. It should be noted that the correction values corresponding to the more sampling portions are desired to be stored, more RAMs may be prepared.

The control portion 30 carries out the control for the radiation intensity and the scanning speed by using the AOD based on a set of correction values for the diffraction intensity commands stored in the RAM1 to the RAM3, respectively, and the correction value for the scanning angle command stored in the RAM4. How the sets of correction values are used is determined based on a parameter set in the personal computer PC. For example, an average of all the sets of correction values is used, or the latest one of the correction values which are successively stored is used. In addition, the same value is used in positions corresponding to the sampling portions in the RAM1 to the RAM3.

The personal computer PC sends level data to the control portion 30, thereby instructing the control portion 30 to use the correction values of which of the sets are used. In addition, the personal computer PC sends a Start signal, a Stop signal and a pause signal to the controller CNT2. When the personal computer PC sends the Start signal to the controller CNT2, the correction value of the RAM specified by the level data is read out, and the diffraction intensity command and the scanning angle command are issued from the controller CNT2 of the control portion 30.

After the diffraction intensity command issued from the controller CNT2 is converted into an analog signal by a D/A converter D/A1, and is then amplified by the amplifier AMP3, the resulting analog signal is sent to the AOD. In addition, after the scanning angle command issued from the controller CNT2 is converted into an analog signal by a D/A converter D/A2, and is then amplified by the amplifier AMP4, the resulting analog signal is sent to the AOD.

In such a control portion 30, the controllers CNT1 and CNT2, the RAM1 to the RAM4, and the counter are configured in the form of a Field Programmable Gate Array (FPGA). As a result, detection timing for the reflected light quantity and the scanning position, selection of the data from the RAMs, and sending timings for the diffraction intensity command and the scanning angle command can be determined in accordance with the setting of the various kinds of parameters made by the personal computer PC.

[Example of Laser Annealing Method: Scanning Angle Correction]

Figure 10:
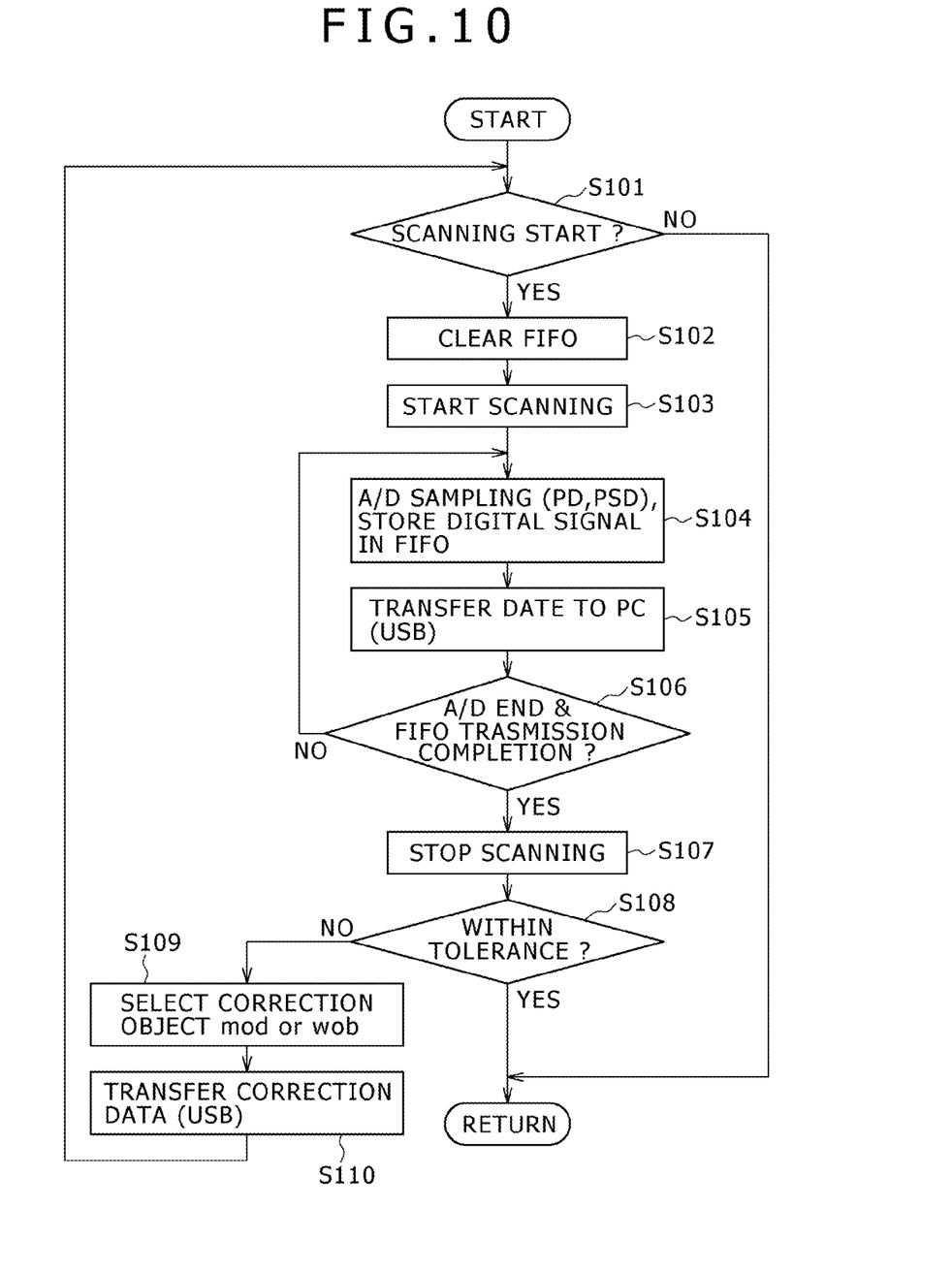
FIG. 10 is a flow chart explaining a flow of an operation for correcting the scanning angle.

FIG. 10 is a flow chart explaining a flow of an operation for correcting the scanning angle. Firstly, when a command to start the scanning of the laser beam is issued from the control portion 30 (Step S101), the contents of the memory portion as the FIFO are cleared (Step S102), and the scanning operation is started (Step S103).

Next, the signal sampled by the reflected light position detector PSD is sampled, is converted into the digital signal by the A/D converter A/D2, and is stored in the memory portion as the FIFO2 (Step S104). Next, the digital signal stored in the memory portion (the FIFO2) is transferred to the personal computer PC (Step S105). When the sampling of the signal detected by the reflected light position detector PSD, and the transfer of the signal to the personal computer PC are completed by a predetermined number of samplings (Step S106), the scanning operation is stopped (Step S107). While the scanning operation is stopped, the personal computer PC carries out the arithmetic operation for comparing the digital signal corresponding to the radiation position with the preset reference value, and judges whether or not the difference between the digital signal corresponding to the radiation position and the preset reference value falls within the tolerance (Step S108).

When it is judged that the difference between the digital signal corresponding to the radiation position and the preset reference value falls within the tolerance, the value of the current scanning angle command is maintained. On the other hand, when it is judged that the difference between the digital signal corresponding to the radiation position and the preset reference value does not fall within the tolerance, the personal computer PC calculates the correction value so that that difference falls within the tolerance, and selects the objective RAM (Step S109). Also, the control portion 30 receives the correction data from the personal computer PC (Step S110). When the control portion 30 receives the correction value from the personal computer PC, the control portion 30 rewrites the contents of the RAM thus selected into the correction value.

When the setting of the correction value for the scanning angle as described above is carried out for an initial value, preferably, the initial value is fetched by using a silicon single crystal substrate. The reason for this is because the scanning angle can be precisely corrected by using the reflected light since the crystallization is not carried out by the radiation of the laser beam when the silicon single crystal substrate is used. In addition, after the initial value is fetched, the fetching of the initial value is carried out every predetermined number of times of the scanning operation when the laser annealing is actually carried out for the amorphous film, thereby updating the correction value for the scanning angle.

[Example of Laser Annealing Method: Correction Processing in Phase of Annealing]

Figure 11:
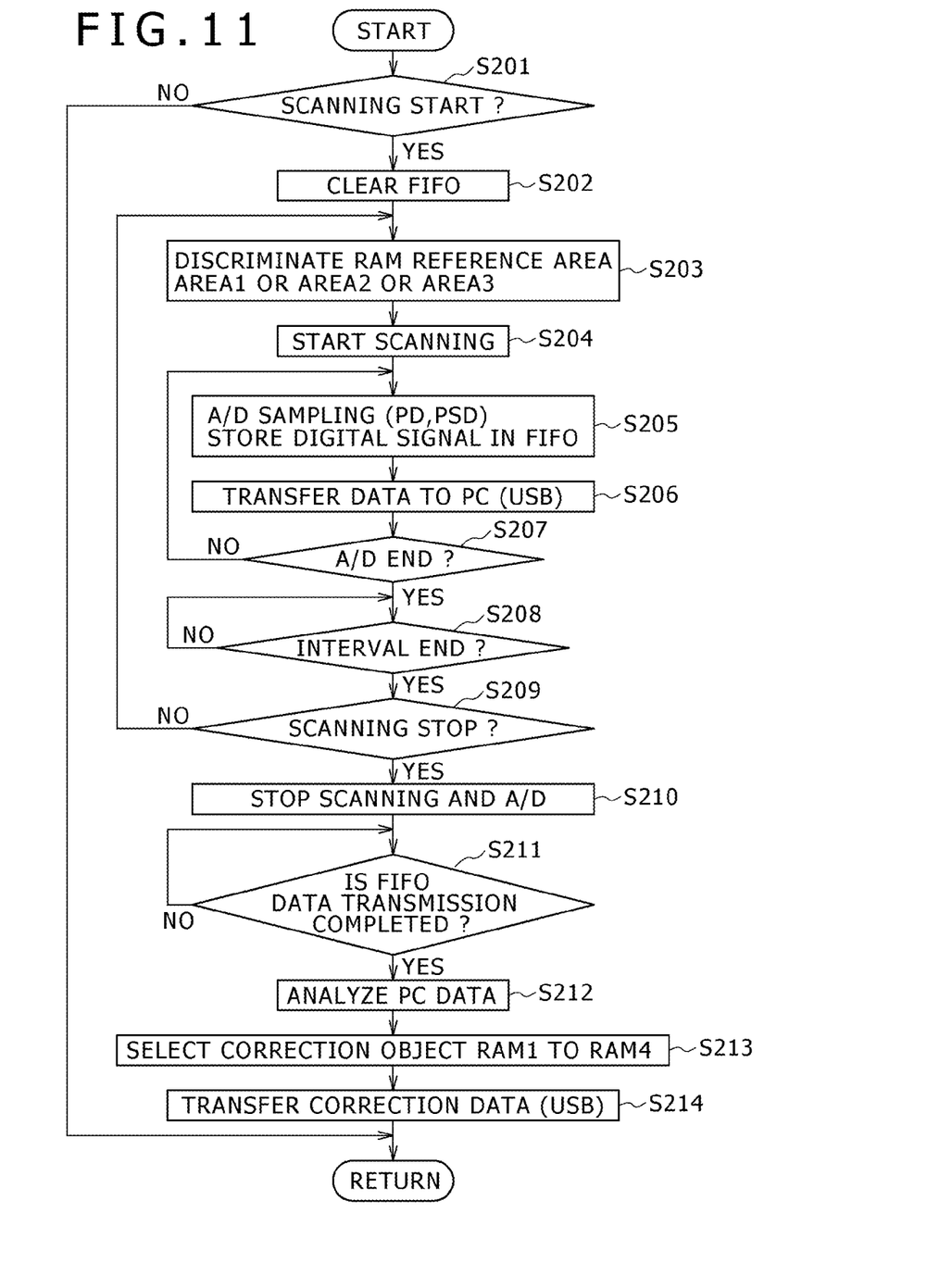
FIG. 11 is a flow chart explaining a flow of an operation for correcting the radiation level.

FIG. 11 is a flow chart explaining the operation for correcting the radiation level. Firstly, when a command to start the operation for scanning the laser beam is issued (Step S201), the contents of the memory portion as the FIFO1 and the FIFO2 are cleared (Step S202), and there is carried out a discrimination about which of a plurality of RAM1 to RAM3 for correction for the diffraction intensity command (radiation level) is aimed at (Step S203). The discrimination is carried out in accordance with the level data sent from the personal computer PC to the control portion 30.

Next, the scanning operation is started (Step S204). Also, the signal detected by the reflected light quantity detector PD is sampled, is converted into the digital signal by the A/D converter A/D1, and is stored in the memory portion as the FIFO1 (Step S205). After that, the control portion 30 transfers the digital signal stored in the FIFO1 to the personal computer PC (Step S206). This processing is repetitively executed until end of a predetermined number of sampling (Step S207).

Next, the interval is held for the predetermined number of times of the scanning operation (Step S208). After completion of the holding of the interval, the control portion 30 judges whether or not the scanning operation is stopped (Step S209). Also, when it is judged in Step S209 that the scanning is not stopped, the control portion 30 repetitively carries out the discrimination about the next RAM, the sampling of the signal detected by the reflected light quantity detector PD, the storing of the digital signal converted in the A/D converter A/D1 in the memory portion as the FIFO, and the transferring of the digital signal to the personal computer PC by the number of samplings (Step S203 to S207). Also, the control portion 30 repetitively executes this processing by the number of RAMs.

After that, when the scanning operation is stopped (Step S210), the control portion 30 judges whether or not the transmission of the digital data in the FIFO1 is completed (Step S211). Also, the personal computer PC carries out the arithmetical operation for comparing the signal thus transferred thereto with the preset reference value, and judges whether or not a difference between the digital signal thus transferred thereto and the preset reference value falls within the tolerance (Step S212). When it is judged in Step S212 that the difference between the digital signal thus transferred and the preset reference value falls within the tolerance, the value of the current diffraction intensity command is held as it is. On the other hand, when the difference between the digital signal thus transferred and the preset reference value does not fall within the tolerance, the correction value is calculated so that the difference between the digital signal thus transferred and the preset reference value falls within the tolerance, the control portion 30 selects the RAM as the object of the correction (Step S213), and receives as its input the correction data from the personal computer PC (Step S214). When the control portion 30 receives as its input the correction value from the personal computer PC, the control portion 30 rewrites the contents of the RAM thus selected into the correction value.

In addition, processing may also be adopted such that the radiation position of the laser beam is detected by the reflected light position detector PSD at the same time that the reflected light quantity of the laser beam is detected by the reflected light quantity detector, and the contents of the RAM4 are updated similarly to the processing in the flow chart shown in FIG. 10.

Figure 12:
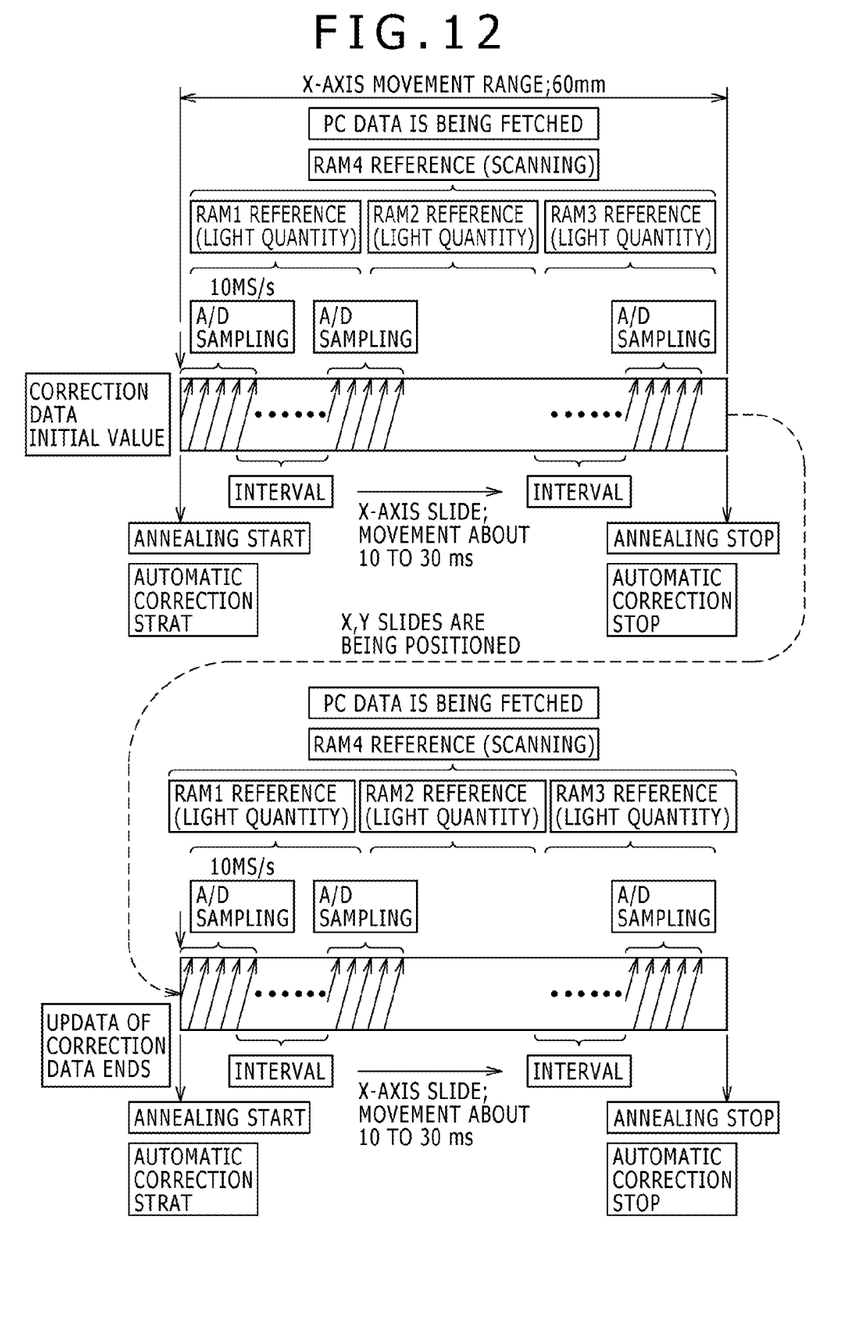
FIG. 12 is a diagram explaining timings for a correcting operation.

FIG. 12 is a diagram explaining timings for the correction operation. In the figure, movement steps of the substrate 10 in an X-axis direction are taken transversely, and data processing between the movement steps is represented in the form of a four-sided frame. In this example, a unit of 60 mm is set as a movement range of the substrate 10 in the X-axis direction. That is to say, one unit of (scanning width×60 mm) is set as the scanning area for the laser beam. Thus, when the scanning operation is completed in this unit, a step (a necessary slide in the X- and Y-directions) of the stage 20 for a movement to a next area is made.

The sampling operation for the correction for the radiation level and the scanning speed of the laser beam is carried out in a plurality of portions at predetermined intervals within one area. The correction values based on the signals from the reflected light quantity detector PD sampled in the plurality of portions are stored in a plurality of RAMs, respectively. In the example shown in FIG. 12, the sampling operation is carried out in the three portions at intervals within one area.

In addition, a value which is fetched in as an initial value and is stored in the RAM4 may be used as the correction value for the sampling angle command. Or, a correction value may be obtained from the signal fetched in the reflected light position detector PSD for the sampling time period in the scanning for each of the areas, and the correction value stored in the RAM4 may be updated with the correction value thus obtained.

In the example shown in FIG. 12, reference is made to the value which is fetched in as the initial value and is stored in the RAM4. In addition, after completion of the sampling operation in a plurality of portions within one area, the annealing processing, that is, the radiation of the laser beam is stopped for a time period until a movement of the stage 20 to a next area. The data sampled for this time period is transferred from the control portion 30 to the personal computer PC. Also, the correction values, for the diffraction intensity command, corresponding to the sampling portions, respectively, arithmetically operated by the personal computer PC are transferred to the RAM1 to the RAM3, respectively.

These correction values are read out together with the correction value stored in the RAM4 when the scanning operation, that is, the annealing processing is started in the next area. For example, the next area is divided into three partition areas. Thus, a set of correction values stored in the RAM1 and the RAM4 is used for the first partition area. A set of correction values in the RAM2 and the RAM4 is used for the next partition area. Also, a set of correction values in the RAM3 and the RAM4 is used for the last partition area. As a result, it is possible to accurately suppress the dispersions of the light quantities of laser beams and the scanning angles depending on the positions within the area.

According to the embodiment of the present invention, the optimal and uniform crystal quality can be stably obtained on a steady basis in the annealing for the amorphous film. In particular, in the embodiment, the dispersion of the crystal quantities formed among the different heads can be reduced in response to the multiple-head promotion (or the multiple-beam promotion) of the laser light sources. In addition, the time period for searching for the parameter conditions about the radiation of the laser beam for obtaining the optimal crystal quantity is greatly shortened.

However, it is possible to uniformly crystallize the amorphous film, and it is also possible to carry out the quantitative quality control for the products manufactured by carrying out the laser annealing. According to the embodiment, the decision of the annealing conditions, for example, requiring several months until now can be made for a time period from several minutes to several hours.

In particular, the embodiment of the present invention is effective as the technique for suppressing the dispersion of the TFT switching elements in the application such as the large-area liquid crystal display device or the organic Electro-Luminescence (EL) display device.

The present application contains subject matter related to that disclosed in Japanese Priority Patent Application JP 2008-263561 filed in the Japan Patent Office on Oct. 10, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A laser annealing method, comprising the steps of:
   irradiating an amorphous film on a substrate with a laser beam while scanning the laser beam along said amorphous film and transmitting the laser beam through a half mirror before the laser beam reaches the amorphous film;
   crystallizing said amorphous film;
   detecting a light quantity of the laser beam as reflected from said amorphous film and the half mirror and a scanning speed of the laser beam while the irradiation and the scanning of the laser beam are carried out for said amorphous film; and
   controlling an irradiation level and the scanning speed of the laser beam based on results of comparison of the light quantity of the laser beam as reflected from said amorphous film, and the scanning speed of the laser beam with respective preset references.

2. The laser annealing method according to claim 1, wherein the control for the irradiation level and the scanning speed of the laser beam based on the comparison of the reflected light quantity of the laser beam and the scanning speed of the laser beam with the respective preset references, and the comparison results is carried out every predetermined number of times of the scanning.

3. The laser annealing method according to claim 1, wherein the comparison of the reflected light quantity of the laser beam and the scanning speed of the laser beam with the respective preset references is carried out every predetermined number of times of the scanning, and the control for the irradiation level and the scanning speed of the laser beam is carried out by using a plurality of results of the comparison carried out every predetermined number of times of the scanning.

4. A laser annealing apparatus, comprising:
   a modulating portion configured to adjust an irradiation level and a scanning speed of a laser beam emitted from a laser light source to be radiated along a radiation path and to an amorphous film on a substrate;

a half mirror disposed along the radiation path of the laser beam and configured to transmit the laser beam outputted from the modulating portion through the half mirror;

a scanning position detecting portion configured to detect a scanning position of the laser beam scanned through said modulating portion;

a reflected light quantity detecting portion configured to detect a light quantity of the laser beam as reflected from said amorphous film and the half mirror; and a control portion configured to (a) compare the scanning speed arithmetically operated from said scanning position of the laser beam detected by said scanning position detecting portion with a preset reference, (b) compare the light quantity of the laser beam as reflected from said amorphous film detected by said reflected light quantity detecting portion with a preset reference, and (c) control the irradiation level and the scanning speed of the laser beam adjusted by said modulating portion in accordance with the comparison results.

5. The laser annealing apparatus according to claim 4, further comprising a memory portion configured to store plural sets of result of the comparison of the scanning speed with the preset reference, and result of the comparison of the reflected light quantity of the laser beam with the preset reference, wherein said control portion controls the light quantity and the scanning speed of the laser beam which are adjusted by said modulating portion by using the plural sets of comparison results stored in said memory portion.

6. The laser annealing apparatus according to claim 4, wherein the reflected light quantity detecting portion is configured to detect the light quantity of the laser beam as transmitted through another half mirror.

7. The laser annealing apparatus according to claim 6, wherein the scanning position detecting portion is configured to detect the scanning position of the laser beam as reflected by the another half mirror.

8. A laser annealing apparatus, comprising:

modulating means for adjusting an irradiation level and a scanning speed of a laser beam emitted from a laser light source to be radiated along a radiation path and to an amorphous film on a substrate;

a half mirror disposed along the radiation path of the laser beam and configured to transmit the laser beam outputted from the modulating means through the half mirror;

scanning position detecting means for detecting a scanning position of the laser beam scanned through said modulating means;

reflected light quantity detecting means for detecting a light quantity of the laser beam as reflected from said amorphous film and the half mirror; and control means for (a) comparing the scanning speed arithmetically operated from said scanning position of the laser beam detected by said scanning position detecting means with a preset reference, (b) comparing the light quantity of the laser beam as reflected from said amorphous film detected by said reflected light quantity detecting means with a preset reference, and (c) controlling the irradiation level and the scanning speed of the laser beam adjusted by said modulating means in accordance with the comparison results.

9. The laser annealing apparatus according to claim 8, wherein the reflected light quantity detecting means is configured to detect the light quantity of the laser beam as transmitted through another half mirror.

10. The laser annealing apparatus according to claim 9, wherein the scanning position detecting means is configured to detect the scanning position of the laser beam as reflected by the another half mirror.

* * * * *